(12) United States Patent
Sevic et al.

(10) Patent No.: US 6,201,444 B1
(45) Date of Patent: Mar. 13, 2001

(54) CURRENT SOURCE BIAS CIRCUIT WITH HOT CARRIER INJECTION TRACKING

(75) Inventors: John F. Sevic, Los Gatos; Francois Hebert, San Mateo, both of CA (US)

(73) Assignee: Spectrian Corporation, Sunnyvale, CA (US)

( * ) Notice: Subject to any disclaimer, the term of this patent is extended or adjusted under 35 U.S.C. 154(b) by 0 days.

(21) Appl. No.: 09/388,295

(22) Filed: Sep. 1, 1999

(51) Int. Cl.$^7$ ........................................................ H03F 3/04
(52) U.S. Cl. ............................................. 330/288; 330/307
(58) Field of Search .................................. 330/256, 288, 330/307

(56) References Cited

U.S. PATENT DOCUMENTS

| | | | |
|---|---|---|---|
| 3,221,182 | * 11/1965 | Anderson et al. | 307/88 |
| 5,392,004 | * 2/1995 | Masliah | 330/296 |
| 5,493,255 | * 2/1996 | Murtojarvi | 330/296 |
| 6,046,642 | * 4/2000 | Brayton et al. | 330/296 |

OTHER PUBLICATIONS

Sze, S.M. , *Physics of Semiconductor Devices*, Second Edition, John Wiley & Sons, p. 77 (1981).
Gray, Paul R. and Meyer, Robert G., *Analysis and Design of Analog Integrated Circuits*, Second Edition, John Wiley & Sons, pp. 233–239 and pp. 705–710 (1977, 1984).

* cited by examiner

*Primary Examiner*—Benny Lee
*Assistant Examiner*—Henry Choe
(74) *Attorney, Agent, or Firm*—Townsend and Townsend and Crew LLP; Henry K. Woodward

(57) ABSTRACT

A current mirror bias circuit for an RF amplifier transistor is modified whereby the reference transistor of the current mirror tracks hot carrier degradation in the RF transistor. Gate bias to the current mirror transistor is modified whereby the drain-to-gate voltage can be positive, and the lightly doped drain region in the lateral n-channel reference transistor is shortened and dopant concentration increased to increase the electric field of the reference transistor to provide the hot carrier injection degradation characteristics similar to the main transistor. Additionally, the gate length of the reference transistor can be shortened to effect the hot carrier injection degradation.

6 Claims, 1 Drawing Sheet

CURRENT SOURCE BIAS CIRCUIT WITH HOT CARRIER INJECTION TRACKING

BACKGROUND OF THE INVENTION

This invention relates generally to insulated gate field effect transistors (IGFETs) and particularly MOSFET transistor circuits in which hot carrier injection is experienced, and more particularly the invention relates to a current source or current mirror bias circuit in which a reference device has characteristics which track degradation in a main device due to hot carrier injection in the main device.

A conventional current source or current mirror circuit comprises a transistor having base-collector (bipolar) or gate-drain (FET) connected whereby the transistor functions as a diode. The circuit is typically used as a biasing element for other transistors so that common operating characteristics are shared by many transistor devices biased by a common current source. Current through the reference transistor is mirrored (exactly or fractionally) in the main transistor.

However, a main transistor with hot carrier injection in the channel/drain regions experiences a degradation of operating characteristics which is not experienced in the reference transistor due to the fact that the drain-gate electric field is zero. The present invention is directed to providing a modified current source bias circuit in which the reference transistor operating characteristics degrade in accordance with hot carrier injection degradation in the main transistor.

SUMMARY OF THE INVENTION

In accordance with the invention, the drain-gate bias on the reference transistor in a current mirror is not held to 0 Volt but is allowed to be positive. This allows the drain-gate electric field to be non-zero. A voltage divider circuit connects the reference voltage at the drain of the reference transistor to the gate of the main transistor.

In a preferred embodiment in which the reference transistor comprises a lateral field effect transistor including a lightly doped drain region, the physical structure of the reference transistor is altered by shortening the gate length, shortening the n-lightly doped drain or high voltage extension region (NHV) of the drain, or by increasing the doping of the NHV region. Any of these changes can increase the electric field in the reference transistor to thereby track hot carrier injection degradation in the main transistor, which is necessary since the drain-gate potential of the reference device is not equal to the drain-gate potential of the main device. Advantageously, each change in the physical structure of the reference transistor is readily accomplished on the same die as the main transistor by using a different photomask dimension for the reference transistor gate, using a different photomask image for the NHV region of the reference device, and by using a different local implant in the NHV region of reference device.

The invention and objects and features thereof will be more readily apparent from the following detailed description and appended claims when taken with the drawing.

DETAILED DESCRIPTION OF ILLUSTRATIVE EMBODIMENTS

Figure 1:
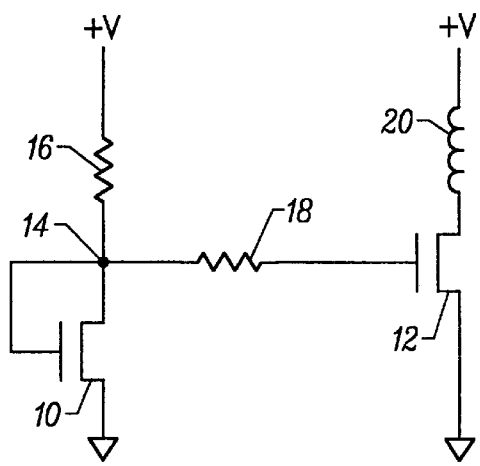
FIG. 1 is a schematic of a conventional current mirror bias circuit.

FIG. 1 is a schematic of a conventional current mirror source including a first transistor 10 for providing a DC bias to an RF amplifier transistor 12. Typically in RF MOSFETs, the transistors are n-channel devices and the invention will be described with reference to such transistors. The gate electrode of the current mirror transistor 10 is connected to the drain of transistor 10 whereby the gate-drain voltage is 0 Volt and transistor 10 functions as a diode device. Reference point 14 of the reference transistor 10 is connected through a first resistor 16 to a +V voltage source, and the reference point 14 is connected to a second resistor 18 to the gate of the main RF transistor 12. An insolation inductor 20 connects the drain of transistor 12 to a +V voltage source, and the sources of transistors 10, 12 are connected to a circuit ground. RF elements of the circuit are not shown.

As described above, the transistor current source is widely used in analog integrated circuits as a biasing element for a main or RF amplifier circuit. The use of current sources in biasing can result in superior insensitivity of circuit performance to threshold drift and to temperature. The implementation of MOS current sources typically employ n-channel enhancement mode MOS transistors which remain in the saturated mode of operation when the gate is shorted to the drain and the gate-source voltage exceeds the threshold voltage for the device. When using MOS transistors, the ratio of the reference current through the current source transistor to the output current through the main transistor is set by ratio of the respective gate widths.

As noted above, when the gate and drain are connected together in the current mirror circuit, the reference transistor is unable to track the main transistor when the main transistor experiences degradation due to hot carrier injection. In accordance with the present invention, a circuit is provided in which a stable bias voltage source is provided that does degrade in accordance to hot carrier injection of the main or RF device. To accomplish this, the drain-to-gate electric field of the reference device must be the same as the main device for identical physical strictures. This is accomplished first by altering the topology of the current mirror circuit, and secondly by altering the physical characteristics of the reference transistor.

Figure 2:
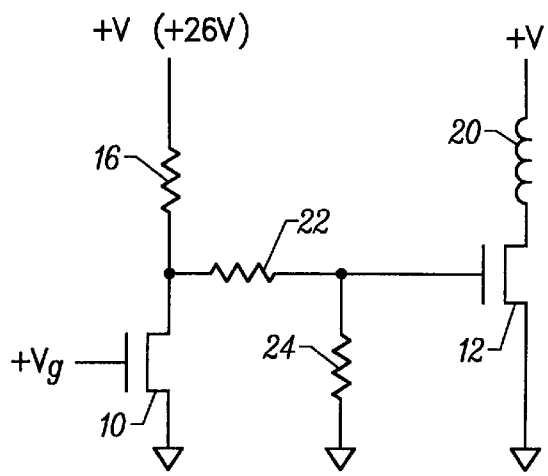
FIG. 2 is a schematic of a current mirror bias circuit in accordance with one embodiment of the invention.

FIG. 2 is a schematic illustrating the modification of the current source bias network in which similar elements to those in FIG. 1 are illustrated and have the same reference numerals. However, in the reference transistor 10 the gate is connected to a bias voltage, $+V_g$, which is less than the +V bias voltage applied through resistor 16 to the drain. Accordingly, the drain-to-gate voltage can be positive, resulting in a non-zero electric field. Further, resistor 18 of FIG. 1 is replaced by a voltage divider comprising resistor 22 connecting the drain of transistor 10 to the gate of transistor 12 and a resistor 24 connecting the gate of transistor 12 to circuit ground.

Figure 3:
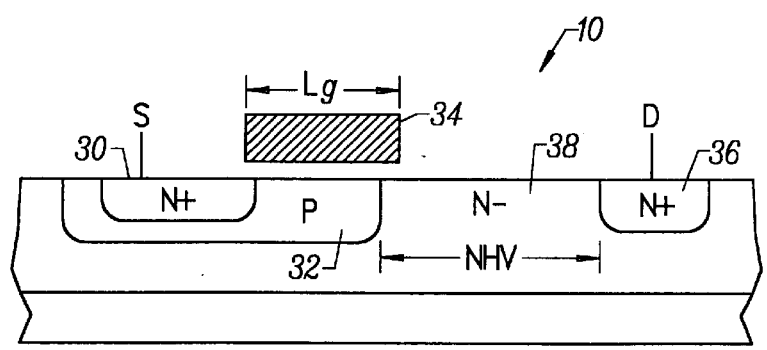
FIG. 3 is a section view of the reference transistor in the circuit of FIG. 2 illustrating physical modifications to scale the drift of the reference transistor to that of the main transistor by providing an increased electric field in the channel/drain of the reference transistor.

Additionally, the physical characteristics of reference transistor 10 are altered as illustrated in the section view of FIG. 3. In FIG. 3 reference transistor 10 is a lateral MOSFET having an n+ source 30, a p-doped channel 32 with a gate electrode 34 thereover, and a drain comprising a heavily doped n+ region 36 and a lightly doped region (NHV) 38 between channel 32 and the heavily doped region 36. In accordance with the invention and for providing tracking of the reference transistor 10 when the main transistor 12 is experiencing hot carrier injection, the electric field in the channel/drain of reference transistor 10 is increased by shortening the length $L_g$ of gate 34, decreasing the length of the lightly doped drain region (NHV) 38, and increasing the doping concentration of the n– lightly doped region 38. By providing identical electric fields in the two transistors, both devices see similar hot carrier injection degradation and tracking is provided as in a conventional current mirror. The electric field quality is maintained empirically by shortening the gate length, shortening the NHV extension, and by increasing the NHV doping. Each of these parameters will enhance hot carrier injection and all three can be implemented on the same die by using different mask dimensions for the reference device gate versus the main device gate, a different mask dimension for the lightly doped drain extension of the reference device s compared to the main device, and by providing a different local implant for the doping adjustment of the lightly doped drain.

The circuit illustrated in FIG. 2 can be integrated on one RF power chip with one additional lead ($V_g$ of the reference transistor) provided for the gate bias voltage. Compensation can then be varied by varying the bias voltage on the reference transistor.

In one embodiment resistor 16 was 50 ohms, resistor 22 was 1100 ohms, and resistor 24 was 250 ohms. Gate width of the reference transistor was 1 millimeter, while channel width of the main transistor was 50 millimeters. The power supply (+V) was 26 Volts, and the bias voltage, $V_{gs}$, applied to threshold was varied from ±10% of nominal. Dopant profile and dimensions of the source, channel, and N+ drain of both transistors are identical, particularly if both devices are integrated on the same die. The lightly doped drain region and/or gate length of the reference transistor can be altered in order to increase the electric field near the drain side of the gate.

For example, a typical main transistor for base station applications may have a lightly doped drain length of 2.5–3.5$\mu$ distance between the edge of the gate (drain side) to the N+ contact and a gate length of 0.6–1.0$\mu$ to ensure a $BV_{dss}$ in excess of 60 volts. Transistor 10 drift length is reduced by 0.5–1.5$\mu$ and gate length is reduced by 0.05–0.15$\mu$. These are simple layout changes not requiring additional masks to realize the combined transistors.

Alternatively, doping concentration in the lightly doped drain region of transistor 10 can be increased relative to that of transistor 12 to achieve increased electric field on the drain side of the gate. Typically the dose can be increased by 15–50%. This embodiment does require one additional mask and implant. The mask is used to protect main transistor 12 and opens up the low doped drain region of reference transistor 10 on the drain side of the gate.

The modified current mirror circuit in accordance with the invention permits a reference transistor to track a main transistor under hot carrier degradation in the main transistor whereby a stable Vgs reference is provided for the main transistor that degrades in accordance with the hot carrier injection. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF amplifier circuit having a current mirror bias comprising a first n-channel field effect transistor having a source, a drain, a channel between the source and drain, and a gate overlying the channel, a second n-channel field effect transistor having a source, a drain, a channel between the source and drain, and a gate overlying the channel, a first resistor connecting the drain of the first transistor to the first voltage potential (+V), means connecting the source of the first transistor to a circuit ground potential, a second resistor connecting the drain of the first transistor to the gate of the second transistor, a third resistor connecting the gate of the second transistor to the circuit ground potential, a conductor connecting the drain of the second transistor to the first voltage potential (+V), and voltage bias means for biasing the gate of the first transistor to a voltage lower than the first voltage potential whereby the gate to drain voltage of the first transistor can be negative, wherein the first transistor is a lateral transistor with a drain region including a lightly doped drain region (NHV) between the channel and a more heavily doped drain region, the length and doping concentration of the lightly doped drain region being adjusted whereby the first transistor has operating characteristics which degrade in accordance with hot carrier injection degradation in the second transistor.

2. The circuit as defined by claim 1, wherein the lightly doped drain length is shortened and doping concentration is increased to increase the electric field in the first transistor.

3. A current mirror circuit for providing a DC voltage bias to an RF transistor comprising a lateral n-channel field effect transistor having a source, a drain, a channel, and a gate overlying the channel, a first voltage applied through a first resistance to the drain of the field effect transistor, a second voltage applied to the gate of the field effect transistor whereby the drain-to-gate voltage can be positive, and a second resistance connecting the drain of the field effect transistor to a gate of an RF transistor, wherein the first resistance comprises a resistor and a second resistance comprises a voltage divider including a plurality of resistors with a first resistor connected between the drain of the field effect transistor and the gate of the RF transistor, and a second resistor connected between the gate of the RF transistor and the source of the field effect transistor, whereby drain-to-gate voltage of the RF transistor can be positive, and wherein the lateral n-channel field effect transistor has a drain region including a lightly doped drain region (NHV) between the channel and the more heavily doped drain region, the length and doping concentration of the lightly doped drain being adjusted whereby the first transistor has operating characteristics which degrade in accordance with the hot carrier injection degradation in the RF transistor.

4. The current mirror circuit as defined by claim 3 wherein the lightly doped drain length is shortened and the doping concentration is increased to increase electric field in the field effect transistor.

5. A current mirror circuit for providing a DC voltage bias to an RF transistor comprising a lateral n-channel field effect transistor having a source, a drain, a channel, and a gate overlying the channel, a first voltage applied through a first resistance to the drain of the field effect transistor, a second voltage applied to the gate of the field effect transistor whereby the drain-to-gate voltage can be positive, and a second resistance connecting the drain of the field effect transistor to a gate of an RF transistor, wherein the lateral n-channel field effect transistor has a drain region including a lightly doped drain region (NHV) between the channel and the more heavily doped drain region, the length and doping concentration of the lightly doped drain being adjusted whereby the first transistor has operating characteristics which degrade in accordance with the hot carrier injection degradation in the RF transistor.

6. The current mirror circuit as defined by claim 5 wherein the lightly doped drain length is shortened and the dopant concentration is increased to increase the electric field in the field effect transistor.

* * * * *